(12) United States Patent
Park (10) Patent No.: US 8,914,248 B2
(45) Date of Patent: Dec. 16, 2014

(54) DEVICE FOR ESTIMATING INTERNAL RESISTANCE OF BATTERY AND BATTERY PACK INCLUDING THE SAME

(75) Inventor: Jaehoon Park, Yongin-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 497 days.

(21) Appl. No.: 13/363,564

(22) Filed: Feb. 1, 2012

(65) Prior Publication Data

US 2012/0303301 A1    Nov. 29, 2012

(30) Foreign Application Priority Data

May 25, 2011    (KR) .................... 10-2011-0049360

(51) Int. Cl.
G01R 31/36    (2006.01)

(52) U.S. Cl.
CPC ........ G01R 31/3662 (2013.01); *G01R 31/3658* (2013.01)
USPC .......................................................... 702/63

(58) Field of Classification Search
CPC .................................................. G01R 31/3662
USPC .......................................................... 702/63
See application file for complete search history.

(56) References Cited

U.S. PATENT DOCUMENTS

| 5,764,034 A | 6/1998 | Bowman et al. |
| 2004/0150406 A1 | 8/2004 | Laig-Hoerstebrock |
| 2007/0145953 A1 | 6/2007 | Asai et al. |
| 2007/0200567 A1* | 8/2007 | Mizuno et al. ............... 324/430 |
| 2008/0120050 A1 | 5/2008 | Iwane et al. |
| 2008/0224709 A1* | 9/2008 | Tae et al. ................. 324/430 |
| 2009/0295399 A1 | 12/2009 | Ueda et al. |
| 2010/0156356 A1 | 6/2010 | Asakura et al. |
| 2010/0250038 A1 | 9/2010 | Morita et al. |
| 2011/0204898 A1 | 8/2011 | Kim et al. |
| 2012/0046893 A1* | 2/2012 | Kaneko et al. .............. 702/63 |

FOREIGN PATENT DOCUMENTS

| JP | 10197613 | 7/1998 |
| JP | 11-27867 A | 1/1999 |
| KR | 1996-0042090 A | 12/1996 |
| KR | 1999-0022782 A | 3/1999 |
| KR | 2007-0097623 A | 10/2007 |
| KR | 2010-0052417 A | 5/2010 |
| WO | 2005045453 A1 | 5/2005 |

OTHER PUBLICATIONS

Korean Notice of Allowance dated Dec. 17, 2012 issued by KIPO. Corresponding to KR10-2011-0049360 with Request for Entry of the Accompanying Office Action.
Korean Office Action issued Jun. 25, 2012 in connection with Korean Patent Application Serial No. 10-2011-0049360 and Request for Entry of the Accompanying Office Action attached herewith.

* cited by examiner

*Primary Examiner* — Bryan Bui
(74) *Attorney, Agent, or Firm* — Robert E. Bushnell, Esq.

(57) ABSTRACT

A device for estimating an internal resistance of a battery and a battery pack including the same. The device stores voltage difference values between sampled voltage values and current difference values between sampled current values for a predetermined period of time, periodically selects a maximum value or a minimum value of stored voltage difference values and a maximum value or a minimum value of the stored current difference values, calculates a covariance value and a variance value of the selected voltage difference values and the selected current difference values, and estimates the internal resistance of the battery based on the calculated covariance value and variance value.

20 Claims, 8 Drawing Sheets

DEVICE FOR ESTIMATING INTERNAL RESISTANCE OF BATTERY AND BATTERY PACK INCLUDING THE SAME

CLAIM OF PRIORITY

This application makes reference to, incorporated the same herein, and claims all benefits accruing under 35 U.S.C. §119 from an application for DEVICE FOR ESTIMATING INTERNAL RESISTANCE OF BATTERY AND BATTERY PACK INCLUDING THE SAME earlier filed in the Korean Intellectual Property Office on 25 May 2011 and there duly assigned Korean Patent Application No, 10-2011-0049360.

BACKGROUND OF THE INVENTION

1. Field of the Invention

Embodiments of the present invention relate to a device for estimating internal resistance of a battery and a battery pack including the same.

2. Description of the Related Art

In general, a portable electronic device such as a portable notebook computer, a portable electromotive tool, or the like, has a rechargeable battery pack.

SUMMARY OF THE INVENTION

Embodiments of the present invention provide an improved battery pack including a device for estimating an internal resistance of the battery.

Embodiments of the present invention further provide a device for estimating internal resistance of a battery, which can achieve synchronization of sampled voltage and current values and can improve the reliability of estimated internal resistance of the battery, and a battery pack including the estimating device.

According to one aspect of the present invention, a device for estimating internal resistance of a battery is provided. The device includes a first memory unit that stores voltage difference values between sampled voltage values and current difference values between sampled current values for a predetermined period of time, a selection unit that periodically selects a maximum value of the voltage difference values and a maximum value of the current difference values stored in the first memory unit or selects a minimum value of the voltage difference values and a minimum value of the current difference values stored in the first memory unit, a second memory unit that stores the voltage difference values and the current difference values selected by the selection unit, and a first operation unit that calculates a covariance value of the voltage difference values and the current difference values stored in the second memory unit, and a variance value of the current difference values stored in the second memory unit, and estimates an internal resistance of the battery using the covariance value and the variance values.

In addition, the device may further include a second operation unit that calculates a normalized covariance coefficient using the covariance value and the variance values calculated by the first operation unit.

In addition, the device may further include a digital filter unit that determines that the internal resistance calculated by the first operation unit is a valid value when the covariance coefficient and data stored in the second memory unit are greater than or equal to predefined reference values, respectively.

The device may further include a control unit that controls operations of the first memory unit, the selection unit, the second memory unit, the first operation unit, the second operation unit and the digital filter unit according to a temperature and charged state of the battery.

The first memory unit may include first-in-first-out (FIFO) type buffers.

In addition, the first memory unit may store difference values between presently sampled values and immediately previously sampled values.

When a voltage sampling interval is greater than or equal to a current sampling interval, the selection unit may select the maximum voltage difference value and the maximum current difference value, and when the voltage sampling interval is shorter than the current sampling interval, the selection unit may select the minimum voltage difference value and the minimum current difference value, among the voltage difference values and the current difference values stored in the first memory unit.

The second memory unit may include FIFO type memory banks.

In addition, the second memory unit may store data of pairs of voltage difference values and current difference values in different memory spaces according to the current difference values selected by the selection unit.

The first operation unit may calculate the internal resistance by dividing the covariance value by the variance value.

According to another aspect of the present invention, there is provided a battery pack including a battery including a plurality of battery cells connected to each other in series, and a battery management unit that samples data of voltage and current values of the battery and estimates an internal resistance of the battery using the sampled data. The battery management unit includes a first memory unit that stores voltage difference values between sampled voltage values and current difference values between sampled current values for a predetermined period of time, a selection unit that periodically selects a maximum value of the voltage difference values and a maximum value of the current difference values stored in the first memory unit or selects a minimum value of the voltage difference values and a minimum value of the current difference values stored in the first memory unit, a second memory unit that stores the voltage difference values and the current differences value selected by the selection unit, and a first operation unit that calculates a covariance value of the voltage difference values and the current difference values stored in the second memory unit, and a variance value of the current difference values stored in the second memory unit, and estimates an internal resistance of the battery using the covariance value and the variance values.

In addition, the battery management unit may further include a second operation unit that calculates a normalized covariance coefficient using the covariance value and the variance values.

In addition, the battery management unit may further include a digital filter unit that determines that the internal resistance calculated by the first operation unit is a valid value when the covariance coefficient and data stored in the second memory unit are greater than or equal to predefined reference values, respectively.

The battery management unit may further include a control unit that controls operations of the first memory unit, the selection unit, the second memory unit, the first operation unit, the second operation unit and the digital filter unit according to a temperature and charged state of the battery.

The first memory unit may include FIFO type buffers.

The first memory unit may store difference values between presently sampled values and immediately previously sampled values.

When the voltage sampling interval is greater than or equal to the current sampling interval, the selection unit may selects the maximum voltage difference value and the maximum current difference value, and when the voltage sampling interval is shorter than the current sampling interval, the selection unit may select the minimum voltage difference value and the minimum current difference value, among the voltage difference values and the current difference values stored in the first memory unit.

The second memory unit may include FIFO type memory banks.

In addition, the second memory unit may store data of pairs of voltage difference values and current difference values in different memory spaces according to the current difference values selected by the selection unit.

The first operation unit calculates the internal resistance value of battery by dividing the covariance value by the variance value.

As described above, in the device for estimating internal resistance of a battery constructed according to the principles of the present invention and the battery pack including the estimating device, synchronization of sampled voltage and current values can be achieved while the reliability of estimated internal resistance of the battery can be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

A battery pack includes a plurality of battery cells, and a battery management system that senses voltages of the battery cells, maintains balancing and controls charging and discharging operations of the battery cells.

The battery management system senses voltage and current values of the battery at predetermined sampling intervals. The sensed voltage and current data may be used in protecting the battery or estimating a charged state, that is, an SOC (State of Charge), of the battery. In such a case, it is not necessary to accurately synchronize voltage and current sampling time instants. In a case of using voltage and current values sampled for estimating an internal series resistance of the battery, however, if the sampling of the voltage and current values are not synchronized with each other, it is difficult to accurately estimate the internal resistance of the battery.

In order to overcome the problem, an internal resistance estimating method using running averages of voltage and current values has been proposed. In such a case, however, since the voltage value involves a battery relaxation effect, it is difficult to accurately estimate the internal resistance of the battery.

Hereinafter, embodiments of embodiments of the invention will be described in detail with reference to the accompanying drawings such that they can easily be made and used by those skilled in the art.

Figure 1:
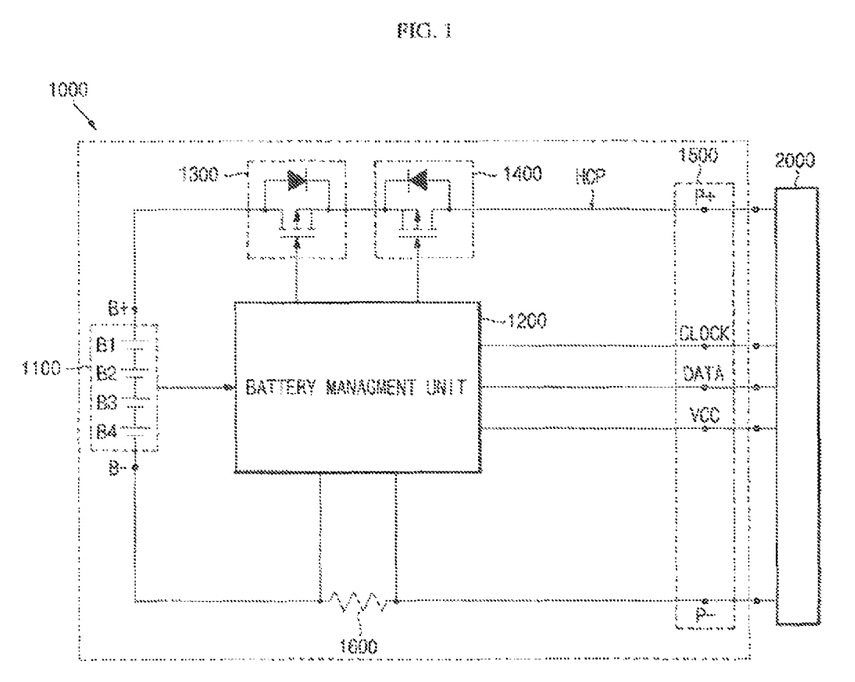
FIG. 1 is a circuit diagram of a battery pack constructed as an embodiment according to the principles of the present invention.

FIG. 1 is a circuit diagram of a battery pack (1000) constructed as an embodiment according to the principles of the present invention.

Referring to FIG. 1, the battery pack 1000 constructed as the embodiment according to the principles of the present invention includes a battery 1100, a battery management unit 1200, a charge device 1300, a discharge device 1400, a connector 1500, and a sensor resistor 1600.

The battery pack 1000 is connected to a charger 2000 through the connector 1500 and performs a charging operation of the battery 1100. In addition, the battery pack 1000 is connected to an external load, also denoted by 2000, such as a cellular phone or a portable notebook computer, through the connector 1500 and performs a discharging operation of the battery 1100. A high current path (HCP) is used as a charge/discharge path between the battery 1100 and the connector 1500 and a relatively large amount of current flows through the HCP. A power supply terminal of the charger or external load 2000 is connected to a first pack terminal (P+) and a second pack terminal (P−) of the connector 1500, and a communication terminal of the charger 2000 is connected to a communication terminal CLOCK, DATA of the connector 1500.

The battery 1100 includes a plurality of battery cells B1, B2, B3 and B4 connected to each other in series and charged or discharged with a predetermined voltage. In FIG. 1, B+ and B− denote electrode terminals, that is, a positive electrode terminal and a negative electrode terminal of the series connected battery cells B1, B2, B3 and B4, respectively. The number of battery cells included in the battery 1100 may vary according to the capacity required by the external load.

The battery management unit 1200 detects a voltage of the battery 1100 and controls operations of the charge device 1300 and the discharge device 1400, thereby controlling charging and discharging operations of the battery 1100. For example, when the battery pack 1000 is connected to the charger 2000 through the connector 1500, the battery management unit 1200 sets the charge device 1300 to an ON state and the discharge device 1400 to an OFF state, thereby controlling the battery 1100 to be charged. In addition, when the battery pack 1000 is connected to the external load 2000 through the connector 1500, the battery management unit 1200 sets the charge device 1300 to an OFF state and the discharge device 1400 to an ON state, thereby controlling the battery 1100 to be discharged. Meanwhile, although not show the battery management unit 1200 may sense voltages of the respective battery cells B1, B2, B3 and B4.

The charge device 1300 and the discharge device 1400 are connected along the HCP between the battery 1100 and the connector 1500, and perform charging and discharging of the battery 1100, respectively. The charge device 1300 includes a field effect transistor (to be referred to as FET 1) and a parasitic diode (to be referred to as D1). The discharge device 1400 includes a field effect transistor (to be referred to as FET2) and a parasitic diode (to be referred to as D 2). A source and a drain of the FET 1 are connected in the opposite direction to a direction in which a source and a drain of the FET 2 are connected. With this configuration, the FET 1 may be configured to limit the flow of current from the connector 1500 to the battery 1100. The FET 2 may be configured to limit the flow of current from the battery 1100 to the connector 1500. The D1 and D2 may be configured to allow the flow of current in the opposite direction to a direction in which the current is limited.

The connector 1500 is connected to the battery 1100. During charging, the connector 1500 is connected to the charger 2000 to then operate as a terminal for charging the battery 1100. During discharging, the connector 1500 is connected to the external load 2000 to then operate as a terminal for discharging the battery 1100. To this end, the connector 1500 includes the first pack terminal P+ and the second pack terminal P−. The first pack terminal P+ may be a positive electrode pack terminal connected to the positive electrode terminal B+ of the battery 1100. The second pack terminal P− may be a negative electrode pack terminal connected to the negative electrode terminal B− of the battery 1100. If the charger 2000 is connected to the connector 1500, charging from the charger 2000 to the battery 1100 may be performed. If the external load 2000 is connected to the charger 2000, discharging from the battery 1100 to the external load 2000 may be performed.

In addition, the connector 1500 includes an auxiliary power supply terminal (VCC). The auxiliary power supply terminal VCC allows power of the battery 1100 to be supplied to the battery management unit 1200. In addition, when the charger 2000 is connected to the battery pack 1000 through the connector 1500, the auxiliary power supply terminal VCC allows charge power of the charger 2000 to be supplied to the battery pack 1000.

The connector 1500 includes communication terminals CLOCK and DATA connected to the battery management unit 1200. The communication terminals CLOCK and DATA include a clock terminal CLOCK and a data terminal DATA. If the charger 2000 is connected to the connector 1500, the communication terminals CLOCK and DATA allow communications to be performed between the battery management unit 1200 and the charger 2000. For example, the communication terminals CLOCK and DATA may transmit voltage information and charge control information of the battery 1100 from the battery management unit 1200 to the charger 2000.

The sensor resistor 1600 is provided along the HCP between the battery 1100 and the connector 1500. In detail, the sensor resistor 1600 is connected between the negative electrode terminal B− of the battery 1100 and the second pack terminal P− of the connector 1500. The sensor resistor 1600 is also connected to the battery management unit 1200. The sensor resistor 1600 allows the battery management unit 1200 to identify charge/discharge current values by checking voltage values of opposite ends of the sensor resistor 1600 and a resistance value of the sensor resistor 1600. Thus, the sensor resistor 1600 serves to transmit information on the charge/discharge current values of the battery 1100 to the battery management unit 1200.

Meanwhile, the battery management unit 1200 samples voltage and current values of the battery 1100 at predetermined sampling intervals and estimates an internal series resistance of the battery 1100 using the sampled data. In the following description of the embodiment of the present invention, a configuration for estimating internal series resistance of the battery 1100 will be described in detail with the battery management unit 1200. In the following description, the battery management unit 1200 will be referred to as a battery internal resistance estimating device.

Figure 2:
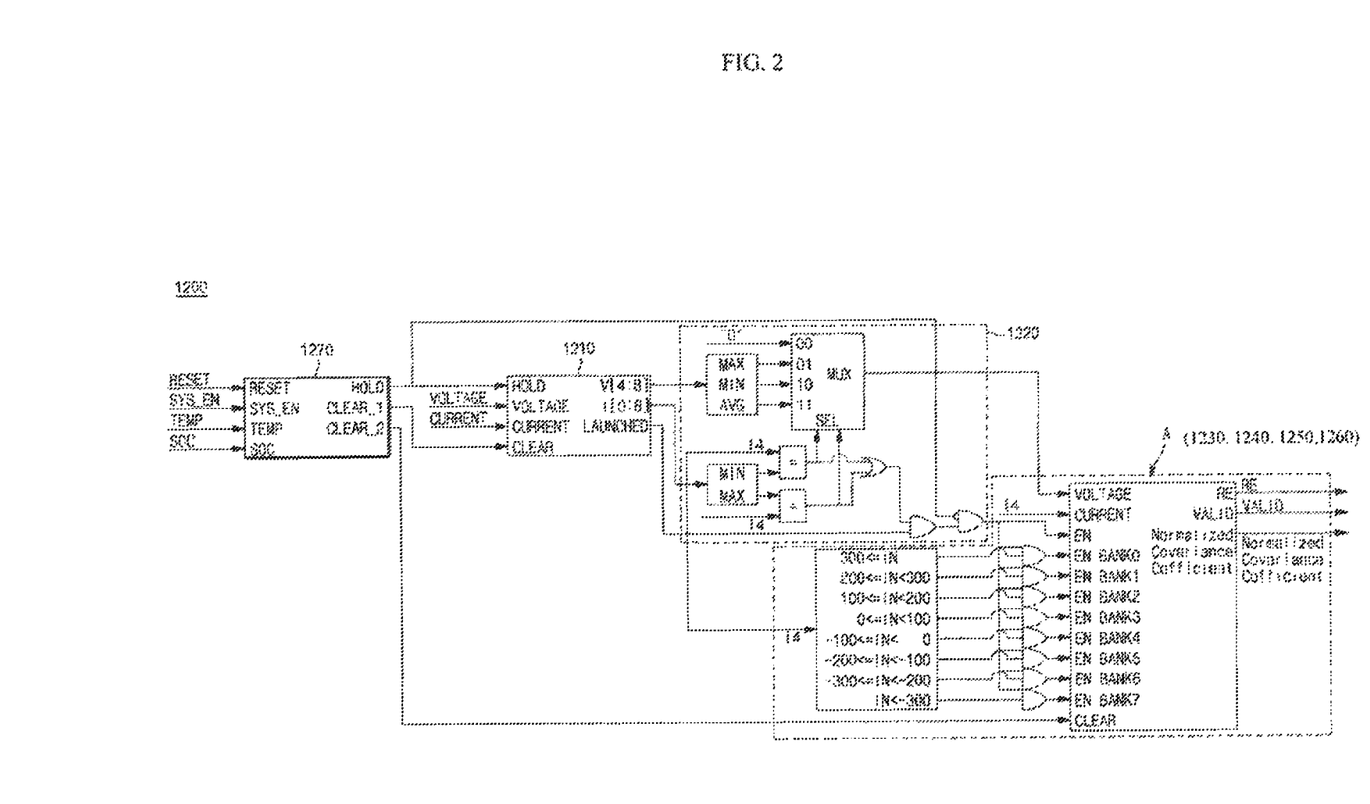
FIG. 2 is a circuit diagram illustrating a configuration of a device for estimating an internal resistance of a battery constructed as an embodiment according to the principles of the present invention.
Figure 3:
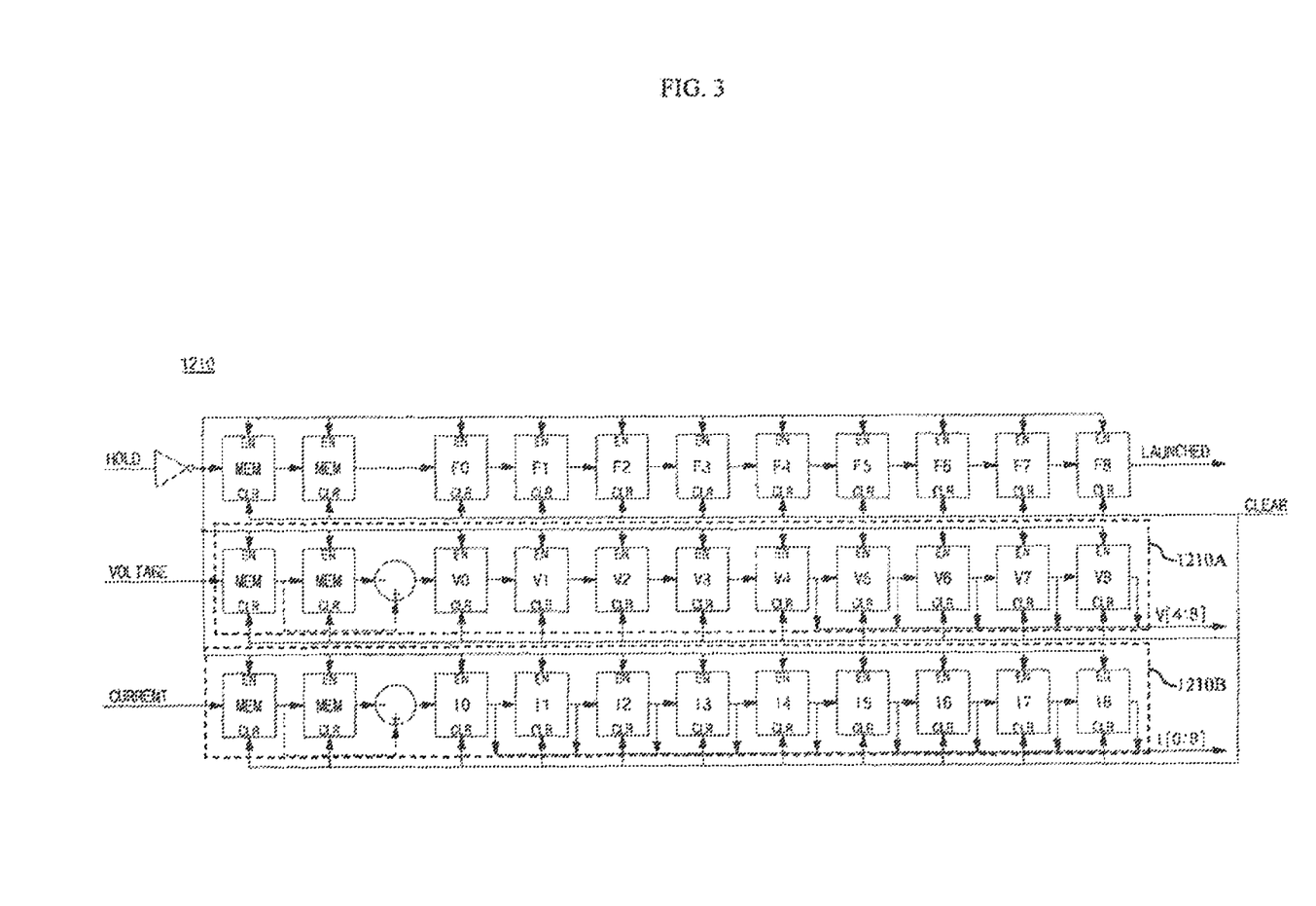
FIG. 3 is a circuit diagram illustrating a configuration of a first memory unit constructed as an embodiment according to the principles of the present invention.
Figure 4:
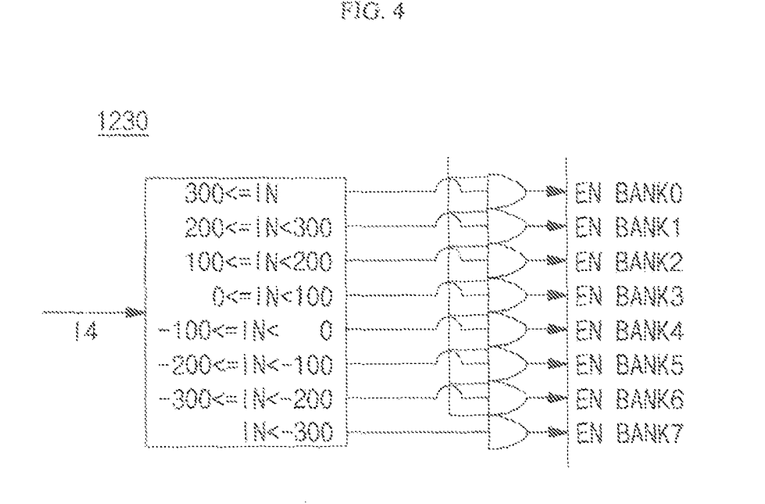
FIGS. 4 to 6 are circuit diagrams illustrating configurations of a second memory unit constructed as an embodiment according to the principles of the present invention.
Figure 5:
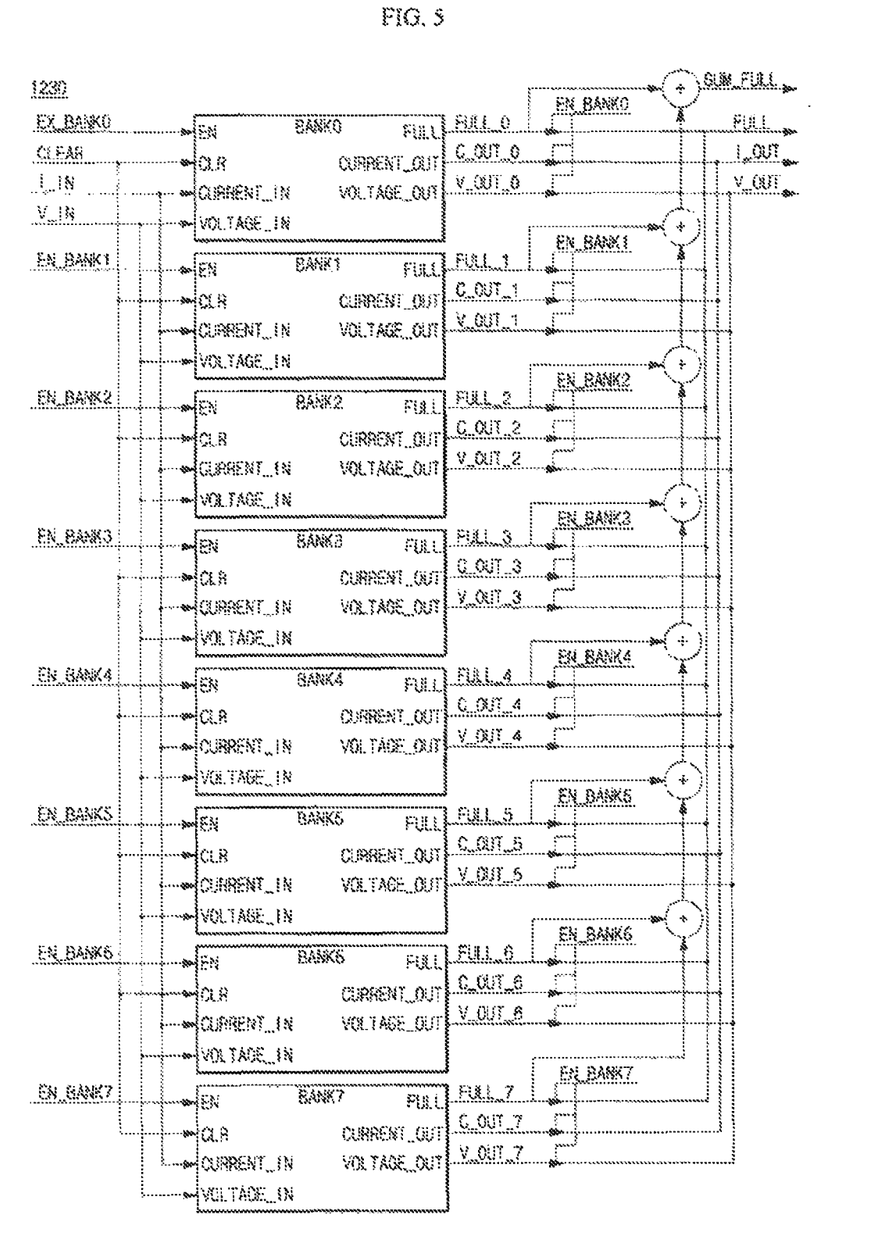
Figure 6:
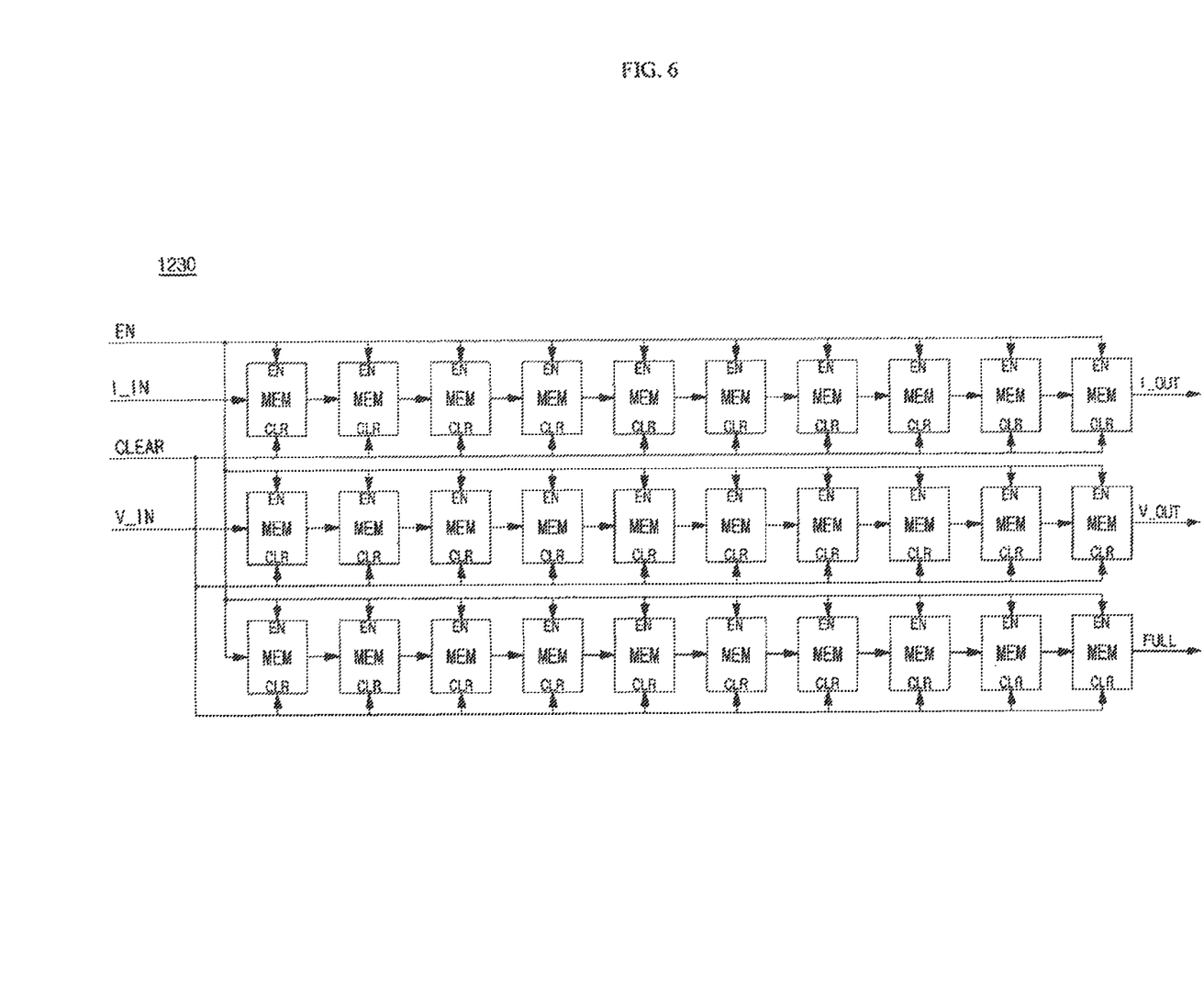
Figure 7:
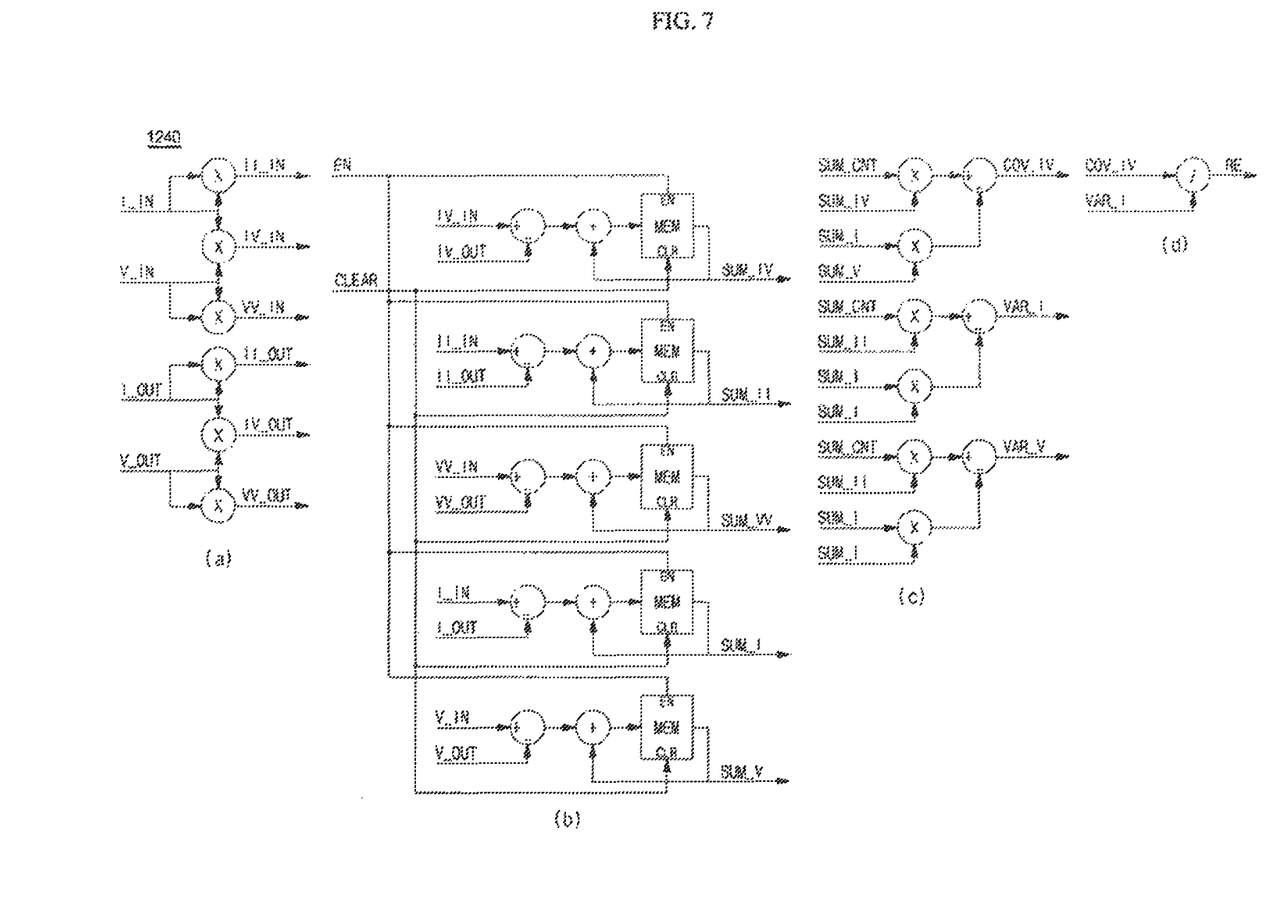
FIG. 7 is a circuit diagram illustrating a configuration of a first operation unit constructed as an embodiment according to the principles of the present invention.
Figure 8:
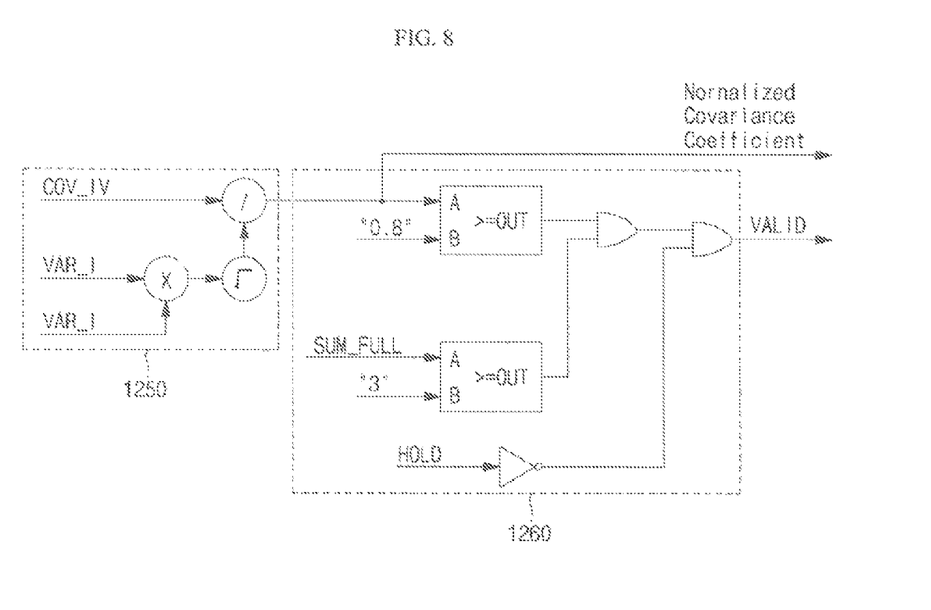
FIG. 8 is a circuit diagram illustrating configurations of a second operation unit and a digital filter unit constructed as an embodiment according to the principles of the present invention.

FIG. 2 is a circuit diagram illustrating a configuration of a battery internal resistance estimating device 1200 for estimating internal resistance of a battery constructed as an embodiment according to the principles of the present invention. FIG. 3 is a circuit diagram illustrating a configuration of a first memory unit 1210 constructed as an embodiment according to the principles of the present invention. FIGS. 4 to 6 are circuit diagrams illustrating configurations of a second memory unit 1230 constructed as an embodiment according to the principles of the present invention. FIG. 7 is a circuit diagram illustrating a configuration of a first operation unit 1240 constructed as an embodiment according to the principles of the present invention. FIG. 8 is a circuit diagram illustrating configurations of a second operation unit 1250 and a digital filter unit 1260 constructed as an embodiment according to the principles of the present invention.

Referring to FIGS. 2 to 8, the battery internal resistance estimating device 1200 includes a first memory unit 1210, a selection unit 1220, a second memory unit 1230, a first operation unit 1240, a second operation unit 1250, a digital filter unit 1260, and a control unit 1270. The second memory unit 1230, the first operation unit 1240, the second operation unit 1250, and the digital filter unit 1260 are collectively shown as circuit A in FIG. 2.

The first memory unit 1210 continuously stores voltage difference values between sampled voltage values and current difference values between sampled current values for a given period of time.

The voltage sampled for estimating internal series resistance of the battery 1100 may include a sum of a voltage employed for estimating the internal series resistance, a voltage based on a relaxation time constant, which is to be briefly referred to as a relaxation voltage, and a battery open circuit voltage (OCV). Since a sampling interval of voltage or current values is relatively short, there is little change in the relaxation voltage or the battery OCV for the duration of the sampling intervals. Therefore, a difference between a presently sampled voltage and an immediately previously sampled voltage may contain information regarding a net battery internal resistance. As shown in FIG. 3, the first memory unit 1210 is configured to store a difference value between a presently sampled voltage value and an immediately previously sampled voltage value and a difference value between a presently sampled current value and an immediately previously sampled current value. Accordingly, the relaxation voltage and OCV components are removed from the sampled voltage value, so that the first memory unit 1210 may store only the voltage based on the net battery internal series resistance.

Referring to FIG. 3, the first memory unit 1210 may further include First In First Out (FIFO)) type buffers 1210A and 1210B. In order to more accurately estimate the internal resistance of the battery, it is necessary to achieve sampling synchronization of voltage and current values with each other. To this end, FIFO type buffers 1210A and 1210B are respectively provided in the first memory unit 1210 and data of voltage and current values are continuously stored in the FIFO type buffers for the given period of time.

When the voltage sampling interval is greater than or equal to the current sampling interval, the selection unit 1220 may select the maximum voltage difference value and the maximum current difference value among the data stored in the first memory unit 1210. Meanwhile, when a voltage sampling interval is smaller than the current sampling interval, the selection unit 1220 may select the minimum voltage difference value and the minimum current difference value among the data stored in the first memory unit 1210.

When one of the voltage difference values stored in the FIFO type voltage buffers 1210A of the first memory unit 1210 becomes the maximum or minimum value, the maximum or minimum value may also be present in the current difference values stored in the FIFO type current buffers 1210B. Thus, the selection unit 1230 achieves synchronization of sampled voltage and current values by matching the maximum voltage difference value with the maximum current difference value or matching the minimum voltage difference value with the minimum current difference value according to the voltage and current sampling intervals. After achieving the synchronization of sampled voltage and current values, the selection unit 1220 outputs a control signal notifying the control unit 1270 of the obtained synchronized voltage and current values to the control unit 1270, thereby allowing the second memory unit 1230 to be enabled by the control unit 1270. That is, if data exists in all FIR) of the second memory unit 1230, the selection unit 1220 outputs a control signal for enabling the second memory unit 1230.

The second memory unit 1230 receives an enable signal EN from the control unit 1270 and stores the voltage difference values and current difference values selected by the selection unit 1220. The second memory unit 1230 may include FIFO type memory banks BANDK0 to BANK7. That is, the selection unit 1220 periodically selects a pair of voltage and current difference values, and the second memory unit 1230 stores a plurality of the selected pairs of voltage and current difference values.

As shown in FIG. 4, the second memory unit 1230 may determine to which range the current difference values selected by the selection unit 1220 belong and may store the voltage difference values and current difference values in corresponding ones of a plurality of FIFO memory banks BANDK0 to BANK7 according to the determination result. Here, as the depth (i.e., number) of FIFO memory banks of the second memory unit 1230 increases, the accuracy of the estimated internal series resistance of battery may increase.

The second memory unit 1230 stores data in different FIFO memory banks according to the value of each one of the current difference value selected by the selection unit 1220, and makes an equal number of the current difference values belong to a range of frequently recurring current values and a range of infrequently recurring current values, thereby increasing a signal to noise ratio (SNR) in estimating the internal resistance of battery, which makes it possible to more accurately estimate the internal resistance of battery. Each of the FIFO type memory banks stores a pair of data composed of a voltage difference value and a current difference value selected by the selection unit 1220 as an information unit. For example, as shown in FIG. 4, "IN" means a current difference value selected by the selection unit 1220. When the value of "IN" is greater than or equal to "200" and is smaller than "300" (that is 200≤IN<300), a pair of the "IN" and a corresponding voltage difference value is stored in BANK1. However, when "IN" is greater than or equal to "−300" and is smaller than "−200" (that is −300≤IN<−200), a pair of the "IN" and a corresponding voltage difference value is stored in BANK6. In the figures, "V[4:8]" represents the voltage difference values $V_4$ to $V_8$ stored in the FIFO type memory banks; "I[0:8]" represents the current difference values $I_0$ to $I_8$ stored in the FIFO type memory banks; "I4" represents the fifth value of the nine current difference values $I_0$ to $I_8$ stored in the FIFO type memory banks; "MUX" represents Multiplex, that is, if selected value changes 00 to 11, the changed value is outputted; "IN" represents input; "SUM FULL" represents a value that informs the number of full memory banks. The full memory bank means that it is filled to memory capacity; and "SUM_CNT" represents the number of the memory banks that stored effective values for resistance calculation of data pair.

The first operation unit 1240 receives the voltage difference values and current difference values stored in the second memory unit 1230, and calculates a covariance value Cov (I, V) and a variance value Var (I). Here, the covariance value Cov (I, V) refers to a covariance value associated with the voltage difference values $V_0, V_1, V_2 \ldots V_{N-1}$ and the current difference values $I_0, I_1, I_2 \ldots I_{N-1}$ respectively stored in the FIFO memory banks $BANDK_0$ to $BANK_{N-1}$ of the second memory unit 1230. The variance value Var (I) refer to a variance value relative to the current difference values $I_0, I_1, I_2 \ldots I_{N-1}$ respectively stored in the FIFO memory banks $BANDK_0$ to $BANK_{N-1}$ of the second memory unit 1230.

The covariance value Cov (I, V) and the variance value Var (I) are calculated using Equations (1) and (2), respectively, and may be implemented in a circuit manner, as shown in FIGS. 7(*a*), 7(*b*), and 7(*c*):

$$\begin{aligned}
\text{Cov}(I, V) &= E[\{I - E(I)\}\{V - E(V)\}] \\
&= E[I \times V - I \times E(V) - V \times E(I) + E(I)E(V)] \\
&= E(I \times V) - E(I)E(V) - E(V)E(I) + E(I)E(V) \\
&= E(I \times V) - E(I)E(V) \\
&= \frac{\sum_{n=0}^{N-1} I_n V_n}{N} - \left(\frac{\sum_{n=0}^{N-1} I_n}{N}\right)\left(\frac{\sum_{n=0}^{N-1} V_n}{N}\right) \\
&= \frac{1}{N^2}\left\{N\sum_{n=0}^{N-1} I_n V_n - \left(\sum_{n=0}^{N-1} I_n\right)\left(\sum_{n=0}^{N-1} V_n\right)\right\} (\text{Unit} A \times V)
\end{aligned} \quad (1)$$

$$\begin{aligned}
\text{Var}(I) &= E[\{I - E(I)\}^2] \\
&= E[I^2 - 2I \times E(I) - E(I)^2] \\
&= E(I^2) - 2E(I)E(I) - E(I)^2 \\
&= E(I)^2 - E(I)^2 \\
&= \frac{\sum_{n=0}^{N-1} I_n^2}{N} - \left[\frac{\sum_{n=0}^{N-1} I_n}{N}\right]^2 \\
&= \frac{1}{N^2}\left\{N\sum_{n=0}^{N-1} I_n^2 - \left(\sum_{n=0}^{N-1} I_n\right)^2\right\}(\text{Unit} A^2)
\end{aligned} \quad (2)$$

In Equation (1), E(V) means the average of the voltage difference values $V_0, V_1, V_2 \ldots V_{N-1}$ respectively stored in the FIFO memory banks $BANDK_0$ to $BANK_{N-1}$ of the second memory unit 1230. In Equations (1) and (2), E(I) means the average of the current difference values $I_0, I_1, I_2 \ldots I_{N-1}$ respectively stored in the FIFO memory banks $BANDK_0$ to $BANK_{N-1}$ of the second memory unit 1230. In Equations (1) and (2), N means the number of FIFO type memory banks of the second memory unit 1230.

In the FIFO memory banks $BANDK_0$ to $BANK_{N-1}$, the current difference values $I_0, I_1, I_2 \ldots I_{N-1}$ are stored in accordance with Table 1 as one embodiment according to the principles of the present invention.

TABLE 1

| BANDK$_0$ | BANDK$_1$ | BANDK$_2$ | ... | BANDK$_{n-3}$ | BANDK$_{n-2}$ | BANDK$_{n-1}$ |
|---|---|---|---|---|---|---|
| I$_{N-1}$ | I$_{N-2}$ | I$_{N-3}$ | ... | I$_2$ | I$_1$ | I$_0$ |

In the FIFO memory banks BANDK$_0$ to BANK$_{N-1}$, the voltage difference values V$_0$, V$_1$, V$_2$ ... V$_{N-1}$ are stored in accordance with Table 2 as one embodiment according to the principles of the present invention.

TABLE 2

| BANDK$_0$ | BANDK$_1$ | BANDK$_2$ | ... | BANDK$_{n-3}$ | BANDK$_{n-2}$ | BANDK$_{n-1}$ |
|---|---|---|---|---|---|---|
| V$_{N-1}$ | V$_{N-2}$ | V$_{N-3}$ | ... | V$_2$ | V$_1$ | V$_0$ |

The range of voltage and current difference values inputted in each memory bank is predetermined. If each voltage and current difference value is applicable to the range, relevant memory bank stores it. Because an operation of each memory bank is mutually exclusive, data is stored in relevant memory bank one at a time. The operation of the memory bank that the voltage and current difference values are concentrated in specific range may be prevented, and thus the reliability of estimated "R" value may be improved.

After calculating the covariance value Cov (I, V) and the variance value Var (I), the first operation unit 1240 estimates the internal resistance RE of the battery. The internal resistance RE of the battery can be calculated using Equation (3) and may be implemented in a circuit manner, as shown in FIG. 7(d)

$$RE = \frac{Cov(I, V)}{Var(I)} \rightarrow \frac{A \times V}{A^2} = \frac{V}{A} (Unit:R) \quad (3)$$

As shown in the Equation (3) and FIG. 7(d), the first operation unit 1240 obtains the internal resistance RE of battery by dividing the covariance value Cov (I, V) by the variance value Var (I).

The second operation unit 1250 calculates a normalized covariance coefficient (NCC) using the covariance value Cov (I, V) and the variance value Var (1) calculated by the first operation unit 1240. The NCC calculated by the second operation unit 1250 is used in determining the reliability of the internal resistance RE calculated by the first operation unit 1240. The closer to 1 the NCC becomes, the higher the reliability of the internal resistance RE becomes. The closer to 0 the NCC becomes, the lower the reliability of the internal resistance RE becomes.

The NCC calculated by the second operation unit 1250 is weighted, and the digital filter unit 1260 determines whether the weighted NCC is greater than or equal to a predefined reference value. Also, the digital filter unit 1260 determines whether the data stored in the second memory unit 1210 is greater than or equal to a predefined reference value. When the NCC and the data stored in the second memory unit 1210 are both greater than or equal to the predefined reference values, the digital filter unit 1260 may notify that the internal resistance RE calculated by the first operation unit 1240 is valid. Referring to FIG. 5, the "data stored in the second memory unit 1210" refers to the sum of FULL$_0$ to FULL$_7$ signal outputted from BANK$_1$ to BANK$_7$. FULL$_n$ means a signal that output if all data respectively stored in FIFO memory banks. That is, when BANKn is filled to memory capacity, the FULLn signal is "1". Otherwise, the FULLn signal is "0".

The control unit 1270 determines whether the temperature and state of charge (SOC) of the battery 1100 are in predetermined ranges, and, if yes, controls the first memory unit 1210, the second selection unit 1220, the second memory unit 1230, the first operation unit 1240, the second operation unit 1250, and the digital filter unit 1260 to be operable. That is to say, the control unit 1270 controls the operation of the overall system according to the temperature and SOC of the battery 1100.

The internal series resistance of the battery 1100 may vary according to the temperature and SOC of the battery 1100. Therefore, the control unit 1270 is configured to set upper and lower limits T1 and T2 of the temperature of the battery 1100 and upper and lower limits S1 and S2 of the SOC of the battery 1100, thereby controlling the system within the ranges as set above.

The control unit 1270 may output an enable signal SYS EN for activating the system and a reset signal RESET for resetting the system to an initial state. In addition, the control unit 1270 may output control signals CLEAR_1, CLEAR_2 and HOLD to be applied to the first memory unit 1210, the second selection unit 1220, the second memory unit 1230, the first operation unit 1240, the second operation unit 1250, and the digital filter unit 1260 according to the temperature TEMP and charged state SOC of the battery 1100.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A device for estimating internal resistance of a battery, comprising:
   a first memory unit that stores voltage difference values between sampled voltage values and current difference values between sampled current values for a predetermined period of time;
   a selection unit that periodically selects a maximum value of the voltage difference values and a maximum value of the current difference values stored in the first memory unit, or selects a minimum value of the voltage difference values and a minimum value of the current difference values stored in the first memory unit;
   a second memory unit that stores the voltage difference values and the current difference values selected by the selection unit; and a first operation unit that calculates a covariance value of the voltage difference values and the current difference values stored in the second memory unit, and a variance value of the current difference values stored in the second memory unit, and estimates an internal resistance of the battery using the covariance value and the variance values.

2. The device of claim 1, further comprising a second operation unit that calculates a normalized covariance coefficient using the covariance value and the variance values calculated by the first operation unit.

3. The device of claim 2, further comprising a digital filter unit that determines that the internal resistance calculated by the first operation unit is a valid value when the covariance coefficient and data stored in the second memory unit are greater than or equal to predefined reference values, respectively.

4. The device of claim 3, further comprising a control unit that controls operations of the first memory unit, the selection unit, the second memory unit, the first operation unit, the second operation unit and the digital filter unit according to a temperature and charged state of the battery.

5. The device of claim 1, wherein the first memory unit includes first-in-first-out (FIFO) type buffers.

6. The device of claim 1, wherein the first memory unit stores difference values between presently sampled values and immediately previously sampled values.

7. The device of claim 1, wherein when a voltage sampling interval is greater than or equal to a current sampling interval, the selection unit selects the maximum voltage difference value and the maximum current difference value, and when the voltage sampling interval is shorter than the current sampling interval, the selection unit selects the minimum voltage difference value and the minimum current difference value, among the voltage difference values and the current difference values stored in the first memory unit.

8. The device of claim 1, wherein the second memory unit includes FIFO type memory banks.

9. The device of claim 1, wherein the second memory unit stores data of pairs of voltage difference values and current difference values in different memory spaces according to the current difference values selected by the selection unit.

10. The device of claim 1, wherein the first operation unit calculates the internal resistance by dividing the covariance value by the variance value.

11. A battery pack, comprising:
a battery including a plurality of battery cells connected to each other in series; and
a battery management unit that samples data of voltage and current values of the battery and estimates an internal resistance of the battery using the sampled data,
wherein the battery management unit comprises:
a first memory unit that stores voltage difference values between sampled voltage values and current difference values between sampled current values for a predetermined period of time;
a selection unit that periodically selects a maximum value of the voltage difference values and a maximum value of the current difference values stored in the first memory unit or selects a minimum value of the voltage difference values and a minimum value of the current difference values stored in the first memory unit;
a second memory unit that stores the voltage difference values and the current difference values selected by the selection unit; and
a first operation unit that calculates a covariance value of the voltage difference values and the current difference values stored in the second memory unit, and a variance value of the current difference values stored in the second memory unit, and estimates an internal resistance of the battery using the covariance value and the variance values.

12. The battery pack of claim 11, wherein the battery management unit further comprises a second operation unit that calculates a normalized covariance coefficient using the covariance value and the variance values calculated by the first operation unit.

13. The battery pack of claim 12, wherein the battery management unit further comprises a digital filter unit that determines that the internal resistance calculated by the first operation unit is a valid value when the covariance coefficient and data stored in the second memory unit are greater than or equal to predefined reference values, respectively.

14. The battery pack of claim 13, wherein the battery management unit further comprises a control unit that controls operations of the first memory unit, the selection unit, the second memory unit, the first operation unit, the second operation unit and the digital filter unit according to a temperature and charged state of the battery.

15. The battery pack of claim 11, wherein the first memory unit includes FIFO type buffers.

16. The battery pack of claim 11, wherein the first memory unit stores difference values between presently sampled values and immediately previously sampled values.

17. The battery pack of claim 11, wherein when a voltage sampling interval is greater than or equal to a current sampling interval, the selection unit selects the maximum voltage difference value and the maximum current difference value, and when the voltage sampling interval is shorter than the current sampling interval, the selection unit selects the minimum voltage difference value and the minimum current difference value, among the voltage difference values and the current difference values stored in the first memory unit.

18. The battery pack of claim 1, wherein the second memory unit includes FIFO type memory banks.

19. The battery pack of claim 11, wherein the second memory unit stores data of pairs of voltage difference values and current difference values in different memory spaces according to the current difference values selected by the selection unit.

20. The battery pack of claim 11, wherein the first operation unit calculates the internal resistance value of battery by dividing the covariance value by the variance value.

* * * * *